United States Patent [19]

Leuthold et al.

[11] Patent Number: 5,172,011
[45] Date of Patent: Dec. 15, 1992

[54] LATCH CIRCUIT AND METHOD WITH COMPLEMENTARY CLOCKING AND LEVEL SENSITIVE SCAN CAPABILITY

[75] Inventors: Dale H. Leuthold, Saratoga, Calif.; Paul M. Guglielmi, Westboro, Mass.

[73] Assignee: Digital Equipment Corporation, Maynard, Mass.

[21] Appl. No.: 375,208

[22] Filed: Jun. 30, 1989

[51] Int. Cl.[5] ............... H03K 3/289; H03K 3/29; H03K 19/086; H03K 5/13
[52] U.S. Cl. ................. 307/272.2; 307/289; 307/455; 307/269
[58] Field of Search ........... 307/272.2, 289, 291, 307/455, 467, 269; 377/78, 115, 116, 117, 104, 75

[56] References Cited

U.S. PATENT DOCUMENTS

| | | | |
|---|---|---|---|
| 4,156,819 | 5/1979 | Takahashi et al. | 307/272.2 |
| 4,689,497 | 8/1987 | Umeki et al. | 307/272.2 |
| 4,733,218 | 3/1988 | Traa | 377/75 |
| 4,777,388 | 10/1988 | Widener | 307/272.2 |
| 4,825,097 | 4/1989 | Bazil et al. | 307/272.2 |
| 4,975,595 | 12/1990 | Roberts et al. | 307/272.2 |

Primary Examiner—Janice A. Howell
Assistant Examiner—Trong Phan
Attorney, Agent, or Firm—Flehr, Hohbach, Test, Albritton & Herbert

[57] ABSTRACT

Latch circuit and method which permit two-phase latches and flip-flops to be intermixed in a system having level sensitive scanning without critical clock requirements. The circuit includes a master latch having a normal data input and a scan data input, and a slave latch connected to the master latch. A differential pair of clock signals is applied to the latches in a complementary manner during a normal mode of operation to load data from the normal data input to the master latch and to transfer the normal data from the master latch to the slave latch, and two separate low frequency non-overlapping scan clock phases are applied to the latches during a level sensitive scanning mode to load data from the scan data input to the master latch and to transfer the scan data from the master latch to the slave latch.

20 Claims, 6 Drawing Sheets

B SLAVE LATCH

LATCH CIRCUIT AND METHOD WITH COMPLEMENTARY CLOCKING AND LEVEL SENSITIVE SCAN CAPABILITY

This invention pertains generally to state elements and, more particularly to a latch circuit and method which permit intermixing of two-phase latches and flip-flops in a single system using a single differential clock.

Two-phase latches and flip-flops each have certain advantages and disadvantages when used in logic circuits. Two-phase latches support level sensitive scanning and permit timing flexibility in certain system applications. However, they require separate non-overlapping clock phases which are difficult to generate, synchronize and distribute to different latches in a system without unacceptable clock skew or loss of synchronization between the phases. Flip-flops are generally favored at higher system clock frequencies since they do not require separate clock phases, but they are not readily adaptable to level sensitive scanning, and this makes the design of a scan clocking system very critical.

Heretofore, three possible clocking schemes have been proposed for high frequency operation: (1) two-phase latches with non-overlapping clocks, (2) two-phase latches with square wave clocks, and (3) flip-flops with square wave clocking. Each of these has certain limitations and disadvantages.

To generate two non-overlapping clock phases, it is necessary to start with a higher clock frequency and divide it down by 4 or more so that there is at least one clock period of spacing between the phases. For a high frequency clock of 250 MHz, for example, the master clock would have to operate at 1 GHz or more. These signals would be difficult to distribute and synchronize, and the resulting clock pulses would be relatively narrow and not optimum for the latches. An additional problem is the need to provide two independent clock distribution systems, each of which must be optimized to prevent skew.

The use of square wave clocks in a two-phase latch system avoids the clock generation problem and permits higher frequency operation. However, it is still necessary to provide two independent clock distribution networks, each optimized for skew. In the event that clock skew does occur, clock phase overlap can occur, allowing the master and slave latches to be open or transparent at the same time. To prevent hold time violations, it is necessary to provide a minimum delay in every logic path between latches, and a direct master to slave connection is not allowed. Partitioning logic to simultaneously satisfy minimum and maximum delay requirements between latches imposes a serious design constraint.

A flip-flop system can operate at high frequency with a simple square wave clock. There is, however, a requirement for a minimum logic path delay between the flip-flops to prevent hold time violations in the presence of clock skew. This requirement applies both to the logic paths and to the scan chain hookup. It is particularly a problem for the scan chain where many additional circuits have to be added to provide the minimum required delay between each stage.

With flip-flops, another problem is providing some means of multiplexing scan data to the inputs of the flip-flops. The addition of multiplexers increases power dissipation and component count and adds to the delay of the logic path.

The invention provides a latch circuit and method which permit two-phase latches and flip-flops to be intermixed in a system having level sensitive scanning without critical clock requirements. The circuit includes a master latch having a normal data input and a scan data input, and a slave latch connected to the master latch. A differential pair of clock signals is applied to the latches in a complementary manner during a normal mode of operation to load data from the normal data input to the master latch and to transfer the normal data from the master latch to the slave latch, and two separate low frequency non-overlapping scan clock phases are applied to the latches during a level sensitive scanning mode to load data from the scan data input to the master latch and to transfer the scan data from the master latch to the slave latch.

Figure 1:
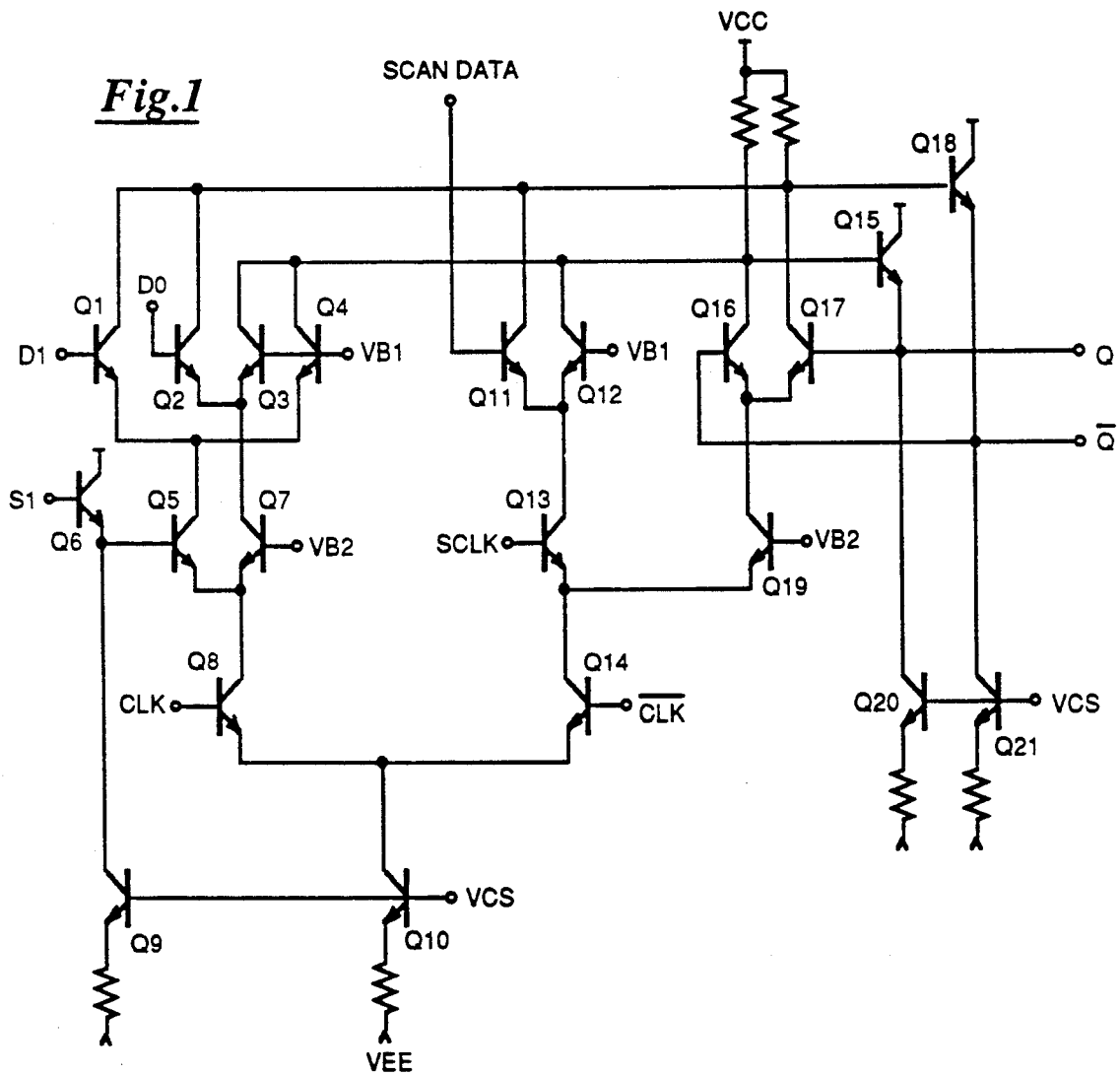
FIG. 1 is a circuit diagram of one embodiment of a master latch circuit with means for selectively loading data from a plurality of inputs.

In the latch circuit of FIG. 1, transistors Q1–Q7 form an ECL (emitter coupled logic) multiplexer for selectively passing data from a first data input D0 and a second data input D1 under the control of a select signal S1. Transistors Q2, Q3 form one ECL pair, with the D0 data being applied to base of transistor Q2 and a reference voltage VB1 centered in the level 1 logic swing being applied to the base of transistor Q3. Transistors Q1, Q4 form a second ECL pair, with the D1 data being applied to base of transistor Q1 and the voltage VB1 being applied to the base of transistor Q4.

Transistors Q5, Q7 form an ECL pair which provides current steering between the pairs Q2, Q3 and Q1, Q4 to allow either the D0 input or the D1 input to be selected as the data output of the multiplexer under the control of the select signal. That signal is applied to the base of transistor Q5 through Q6 which is connected as an emitter follower, and a reference voltage VB2 is applied to the base of transistor Q7. This voltage is approximately one diode drop below the voltage VB1 and is centered in the level 2 logic swing. When the select signal S1 is true (high), transistor Q5 is turned on, steering current to transistors Q1, Q4, thereby selecting the D1 input as the data source for the multiplexer output. When the select signal is false (low), transistor Q7 is turned on, steering current to transistors Q2, Q3, selecting the D0 input as the data source for the output of the multiplexer. Transistors Q15–Q18 form an ECL latch, with transistors Q16, Q17 forming a latch pair and transistors Q15, Q18 feeding back the state of the latch output data to the latch pair to hold data in the latch pair. The data is held whenever current is supplied to transistors Q16, Q17. When current is not being supplied to transistors Q16, Q17, the latch is being loaded with data from the input multiplexer or from a scan data input as described hereinafter in greater detail. Transistors Q15, Q18 are connected as emitter followers which also perform a level shifting function.

Transistors Q11, Q12 and transistors Q13, Q19 form additional ECL pairs which allow the latch to be loaded either with data from the input multiplexer or with scan data from another input. The scan data is applied to the base of transistor Q11, and the voltage VB1 is applied to the base of transistor Q12.

Current is steered either to the input pair Q11, Q12 or to the latch pair Q16, Q17 by transistors Q13, Q19 under the control of a primary clock CLK and a scan clock SCLK. Current is steered to the multiplexer steering pair Q5, Q7 and to the pair Q13, Q19 by an additional pair Q8, Q14 under the control of the primary clock. The primary clock signal CLK is applied to the base of transistor Q8, and its complement $\overline{CLK}$ is applied to the base of transistor Q14. The scan clock SCLK is applied to the base of transistor Q13, and the voltage VB2 is applied to the base of transistor Q19.

The voltage VCC is the most positive voltage in the system and is typically on the order of 0 volts. The voltage VEE is the most negative voltage and is typically on the order of $-5$ volts. Transistors Q9, Q10, Q20 and Q21 serve as current sources for the circuit, and the voltage VCS applied to the bases of these transistors is chosen to provide proper currents for operation of the circuit.

During normal operation of the circuit, scan clock SCLK is false (low), and current is steered to the latch pair Q16, Q17 under the control of the primary clock CLK. When the CLK signal is true (high), current is steered to the input multiplexer by transistor Q8, and data is loaded from the selected data input D0 or D1. No current is supplied to the latch pair Q16, Q17, so the latch is transparent, and the data from the multiplexer appears at the outputs Q, $\overline{Q}$. When the clock signal CLK is false (low), current is steered away from the multiplexer and to the latch pair Q16, Q17, and the latch pair holds the data previously loaded by the multiplexer.

During the scan mode, the primary clock CLK is held low, and current is steered to the scan data input pair Q11, Q12 and to the latch pair Q16, Q17 under the control of the scan data clock SCLK. When the SCLK clock is asserted (high), current is steered to the pair Q11, Q12, and the scan data is loaded into the latch. No current is supplied to the latch pair Q16, Q17, so the latch is transparent, and the scan data appears at the outputs Q, $\overline{Q}$. When the SCLK signal is low, current is steered away from the input pair Q11, Q12 and to the latch pair Q16, Q17, and the latch pair holds the previously loaded scan data.

Operation of the circuit with both the primary clock and the scan clock asserted at the same time is illegal and will result in incorrect logic levels at the latch output and the storage of an indeterminate state in the latch.

The latch circuit of FIG. 1 has a number of important features and advantages. It can accept data from either of two "normal" data inputs or from a scan data input. The transistor pairs employed in the multiplexer also serve as input pairs to the latch, and this requires less power and fewer components than a separate multiplexer, and it also introduces less propagation delay. Only four transistors (Q11–Q13 and Q19) are required to allow the latch to accept scan data in addition to the normal input data, and independent clocks control the loading of data from the different data inputs. The data from the selected multiplexer input is loaded by asserting (making true) the primary clock while the secondary or scan clock (false) is holding the latch. The data from the scan data input is loaded by asserting the scan clock while the primary clock (false) is holding the latch. The data is held in the latch when neither the primary clock nor the scan clock is asserted.

In summary, the circuit of FIG. 1 provides an ECL latch having a 2:1 input multiplexer and the ability to load data from a selected multiplexer input under control of one clock while a second clock is in a state that will hold the latch and to load data from a secondary data input under control of the second clock while the first clock is in a state that will hold the latch. The propagation delay of the circuit is not significantly greater than that of a 2:1 multiplex latch without the second data and clock inputs.

Figure 2:
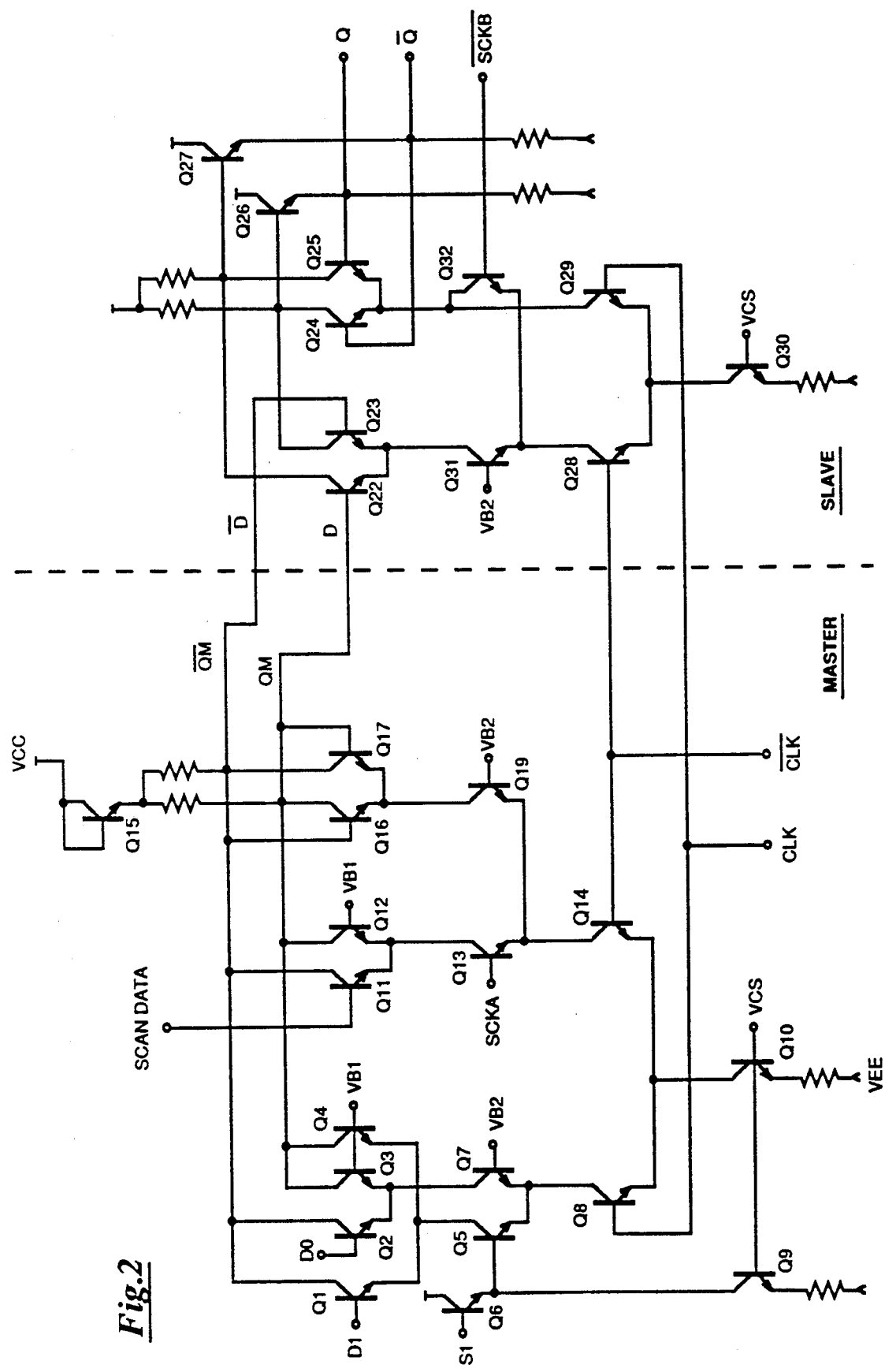
FIG. 2 is a circuit diagram of an embodiment of a master-slave flip-flop circuit having a master latch and a slave latch according to the invention.

The master-slave flip-flop circuit of FIG. 2 includes a master latch which is shown to the left of the dashed line and a slave latch which is shown to the right of this line. The master latch is similar to the circuit of FIG. 1 except for the manner in which the output states are fed back to the latch pair and to the slave latch. Like reference numerals designate corresponding elements in the two figures. In the circuit of FIG. 2, the collector of transistor Q16 is connected directly to the base of transistor Q17, and the collector of transistor Q17 is connected directly to the base of transistor Q16, with the collectors of the two transistors also being connected to the output lines QM, $\overline{QM}$ of the master latch. Transistor Q15 is connected as a level shifting diode to make outputs QM, $\overline{QM}$ compatible with the slave latch input terminals. Since coupling from the master latch to the slave is differential, one half of the normal ECL logic voltage swing can be tolerated. The voltage swing of outputs QM, $\overline{QM}$ should be limited to approximately 300 mV to avoid forward biasing the base-collector junctions of transistors Q16 and Q17.

The slave latch includes an input pair Q22, Q23 and a latch pair Q24, Q25, with the master latch outputs QM, $\overline{QM}$ being applied to the bases of transistors Q22, Q23. Latch pair Q24, Q25 is similar to latch pair Q16, Q17, with transistors Q26, Q27 feeding back the state of the output data to hold data in the latch pair. The data is held whenever current is supplied to the latch pair, and when current is not being supplied to these transistors, the slave latch is being loaded with data from the master latch. Transistor Q30 serves as a current source for the slave latch. When the scan clock $\overline{SCKB}$ is low, current is steered to the input pair or the latch pair by transistors Q28, Q29 under the control of the system clock CLK. When CLK is low, current is steered to the input pair or the latch pair by transistors Q31, Q32 under the control of scan clock $\overline{SCKB}$. It is an illegal operation to make the $\overline{SCKB}$ high while the system clock CLK is running. In the circuit of FIG. 2, the clock signals CLK and $\overline{CLK}$ are a differential pair, and clocking depends upon the relative levels of the two signals, rather than the actual level of either. The clock signal is applied to the two latches in a complementary manner so that the master is transparent with the clock in one state and the slave is transparent when the clock is in the other state. More specifically, the CLK signal is applied to the base of transistor Q8 which steers current to the input pairs Q2, Q3 or Q1, Q4 in the master and to the base of transistor Q29 which steers current to the latch pair Q24, Q25 in the slave. The $\overline{CLK}$ signal is applied to the base of transistor Q14 which steers current to the latch pair Q16, Q17 in the master and to the base of transistor Q28 which steers current to the input pair Q22, Q23 in the slave. Thus, when the CLK signal is asserted (high), the master is transparent and the slave is being held, and when the CLK signal is low, the slave is transparent and the master is being held. Master to slave transfer occurs on the falling edge of clock signal CLK, as the master is closing and the slave is opening. Since clocking is at the third ECL level (level 3), the two upper levels of ECL circuitry are available to implement the logic features of the circuit.

Scan clock signals SCKA and $\overline{SCKB}$ are two low frequency non-overlapping clock phases which control the loading and transfer of scan data in the embodiment of FIG. 2. They are both low in normal operation and can only be asserted when the system clock CLK is stopped in the low state. SCKA is applied to the master latch to clock in scan data in the manner described for the latch of FIG. 1, and $\overline{SCKB}$ is applied to the slave latch to control the master-slave transfer in the scan mode.

In the slave latch of FIG. 2, transistors Q31, Q32 form an ECL pair that receives current from Q28 when the system clock CLK is low. When $\overline{SCKB}$ is low, current in Q31 is steered to the input pair Q22, Q23, and the latch is transparent. When $\overline{SCKB}$ is high, current in Q32 is steered to the latch pair Q24, Q25, and the latch holds data. The result is that in the scan mode, the slave latch is clocked by negative pulses on the $\overline{SCKB}$ terminal.

In the normal mode of operation, SCKA and $\overline{SCKB}$ are both held low, and the circuit operates as a D-type flip-flop. The master operates in the manner described above in connection with the circuit of FIG. 1, loading data when the CLK signal is high and holding data when the CLK signal is low. When the CLK signal is high, transistor Q29 supplies current to the latch pair Q24, Q25 in the slave, and this pair holds the data transferred to it by the master during the previous clock cycle. When the CLK signal is low, the QM and $\overline{QM}$ signals from the master control the flow of current through transistors Q22, Q23, and the slave latch is transparent. Thus the data now held in the master latch pair is transferred to the outputs Q, $\overline{Q}$. As noted above, transfer from the master to the slave occurs as clock signal CLK falls, when the master is closing and the slave is opening.

Figure 3:
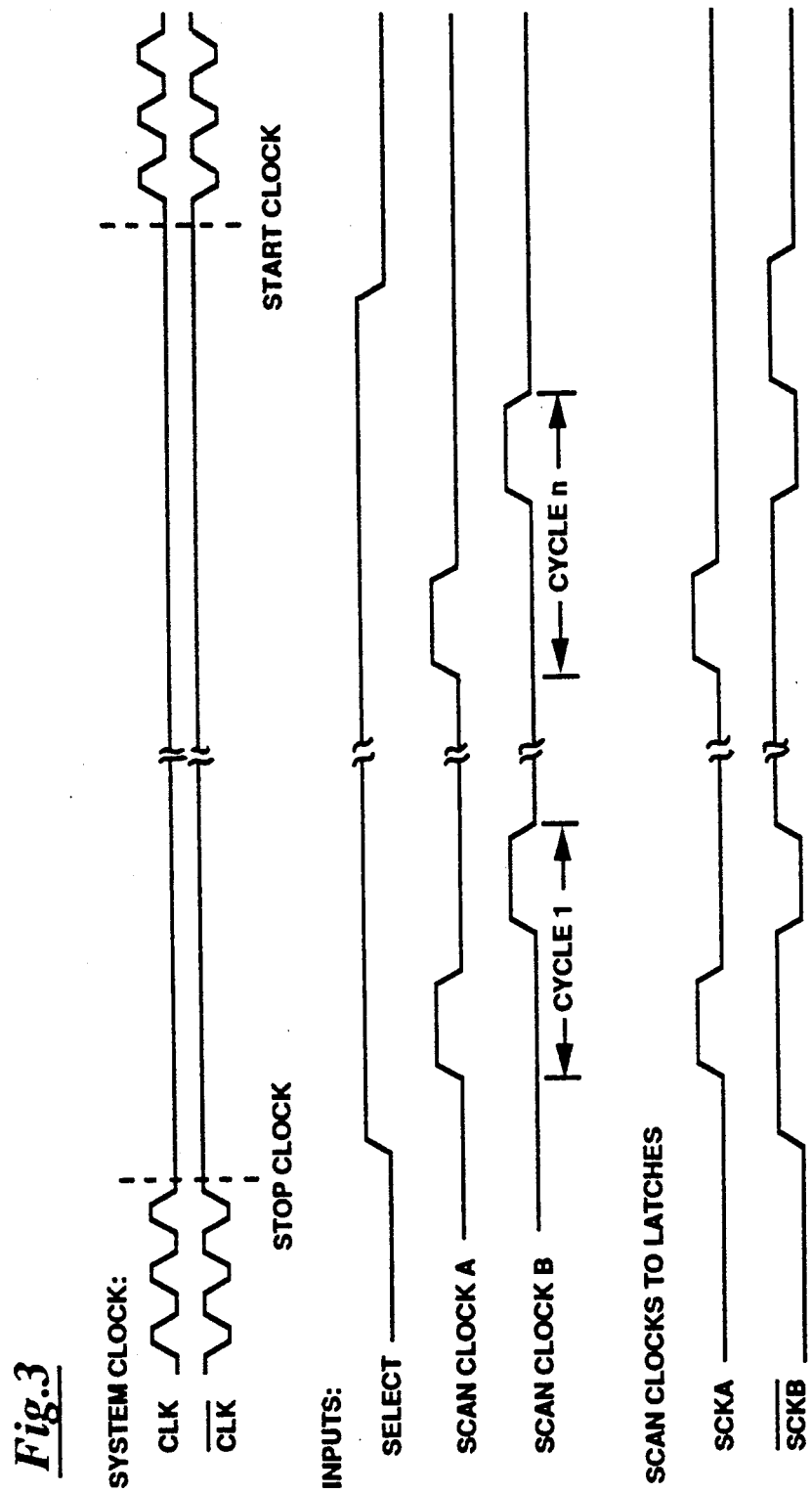
FIG. 3 is a timing diagram illustrating operation of the latch circuit of FIG. 2.

As illustrated by the timing diagram of FIG. 3, the scanning mode is entered by stopping the system clock with CLK low, while SCKA and $\overline{SCKB}$ are both low. As previously described, this causes the master latch in FIG. 2 to be closed (holding data) and the slave latch to be open (transparent). A control signal (SELECT) is then issued, forcing the clock phase $\overline{SCKB}$ high to close the slave latch. Scan clocking begins by asserting the clock phase SCKA, which clocks the scan data into the master latch. After an interval, the inverted scan clock $\overline{SCKB}$ goes low to clock scan data from the master latch to the slave latch. Cycles of the clock phases SCKA and $\overline{SCKB}$ are repeated until the scan ring contents are shifted to the desired position. At this point, the SELECT input is brought low, causing $\overline{SCKB}$ to go low, and allowing the slave latch to become transparent. Normal clocking is then resumed by the rise of the clock signal CLK.

The master-slave flip-flop circuit of FIG. 2 is configured as an edge-triggered D type flip-flop, with only the slave outputs used. In a two-phase latch system, an A latch (master) drives remote B latches, and in addition, the master latch always has an associated slave latch for scan purposes. This master-slave latch pair is created by combining the master latch of FIG. 1 with the slave latch of FIG. 5, tying the Q output of the master to the D input of the slave. For all instances of master-slave pairs, the master and slave latches must be physically adjacent, sharing common clock terminals CLK, $\overline{CLK}$. This insures simultaneous closing of the master latch and opening of the slave latch, preventing master and slave latches from being transparent at the same time, which would result in improper circuit operation and loss of data.

In a two-phase system, the phase A (master) and remote phase B latches do not share the same clock terminals, and it is necessary to put some guaranteed minimum delay in the logic paths between them to prevent hold time violations under conditions of clock skew. This condition also arises where one flip-flop drives another flip-flop.

Figure 4:
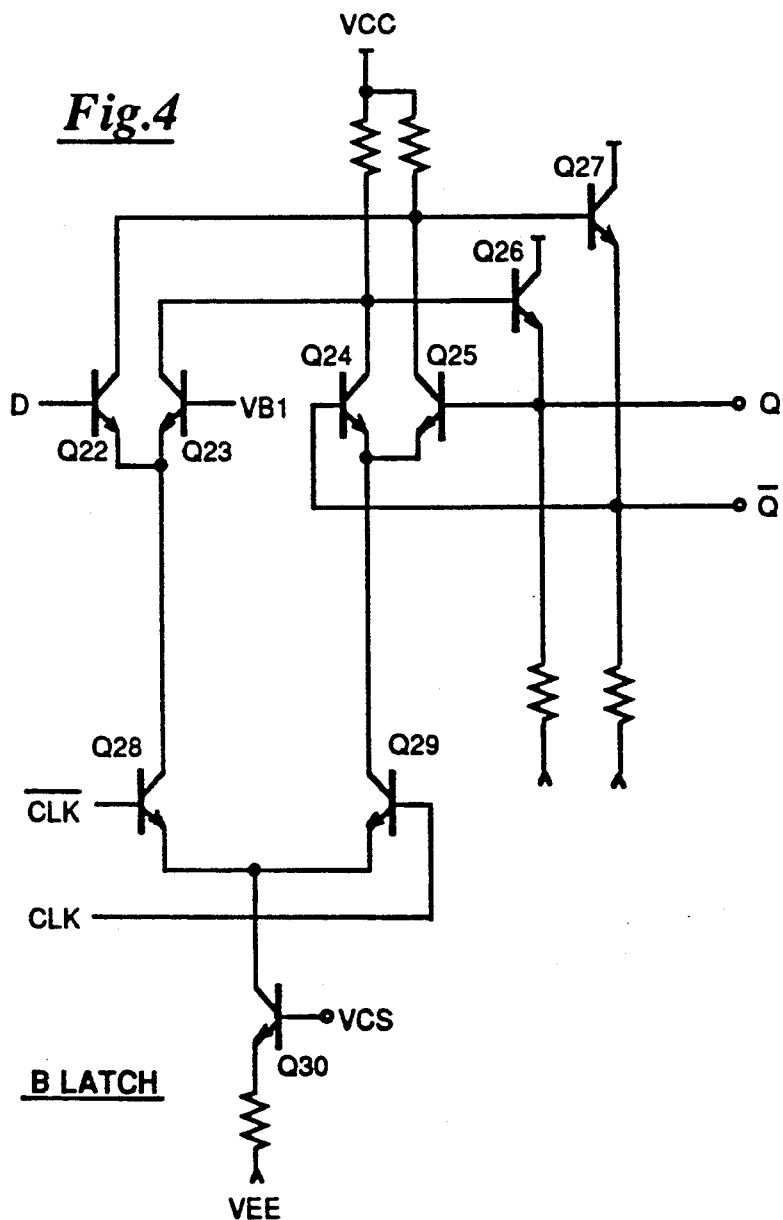
FIG. 4 is a circuit diagram of an embodiment of a B latch circuit according to the invention.
Figure 5:
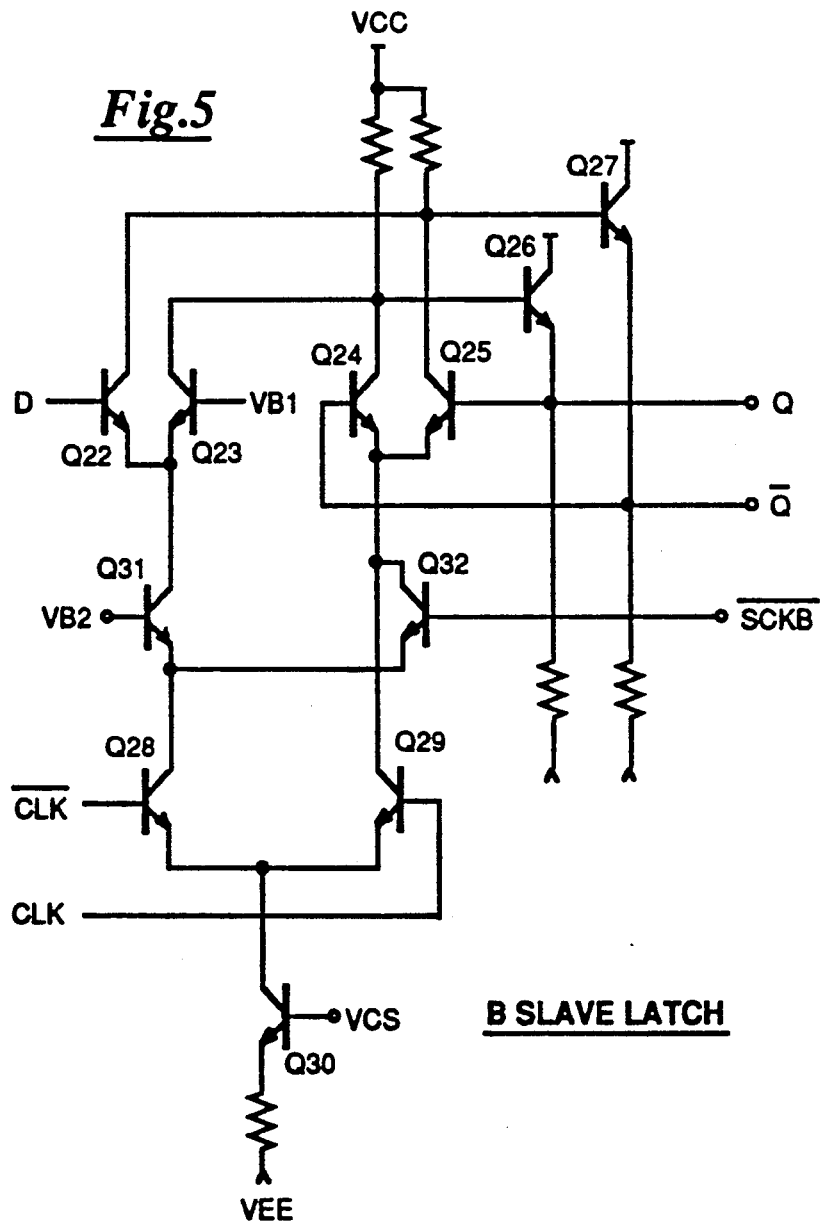
FIG. 5 is a circuit diagram of an embodiment of a B slave latch circuit according to the invention.

The B latch illustrated in FIG. 4 is similar to the slave latch in FIG. 5 without the scanning clock $\overline{SCKB}$ and the switching pair Q31, Q32, and like reference numerals designate corresponding elements in the two figures. In the embodiment of FIG. 4, the collector of transistor Q28 is connected directly to the input pair Q22, Q23, and the collector of transistor Q29 is connected directly to the latch pair Q24, Q25, and the pair Q28, Q29 thus controls the switching of current between the input pair and the latch pair. Input data is applied to the base of transistor Q22 in the input pair, and the voltage VB1 is applied to the base of transistor Q23, the other transistor in the input pair.

The B slave latch shown in FIG. 5 is similar to the slave latch in the embodiment of FIG. 2, and like reference numerals designate corresponding elements in the two figures. In the embodiment of FIG. 5, the input data is applied to the base of transistor Q22 in the input pair, and the voltage VB1 is applied to the base of transistor Q23, the other transistor in the input pair.

Figure 6:
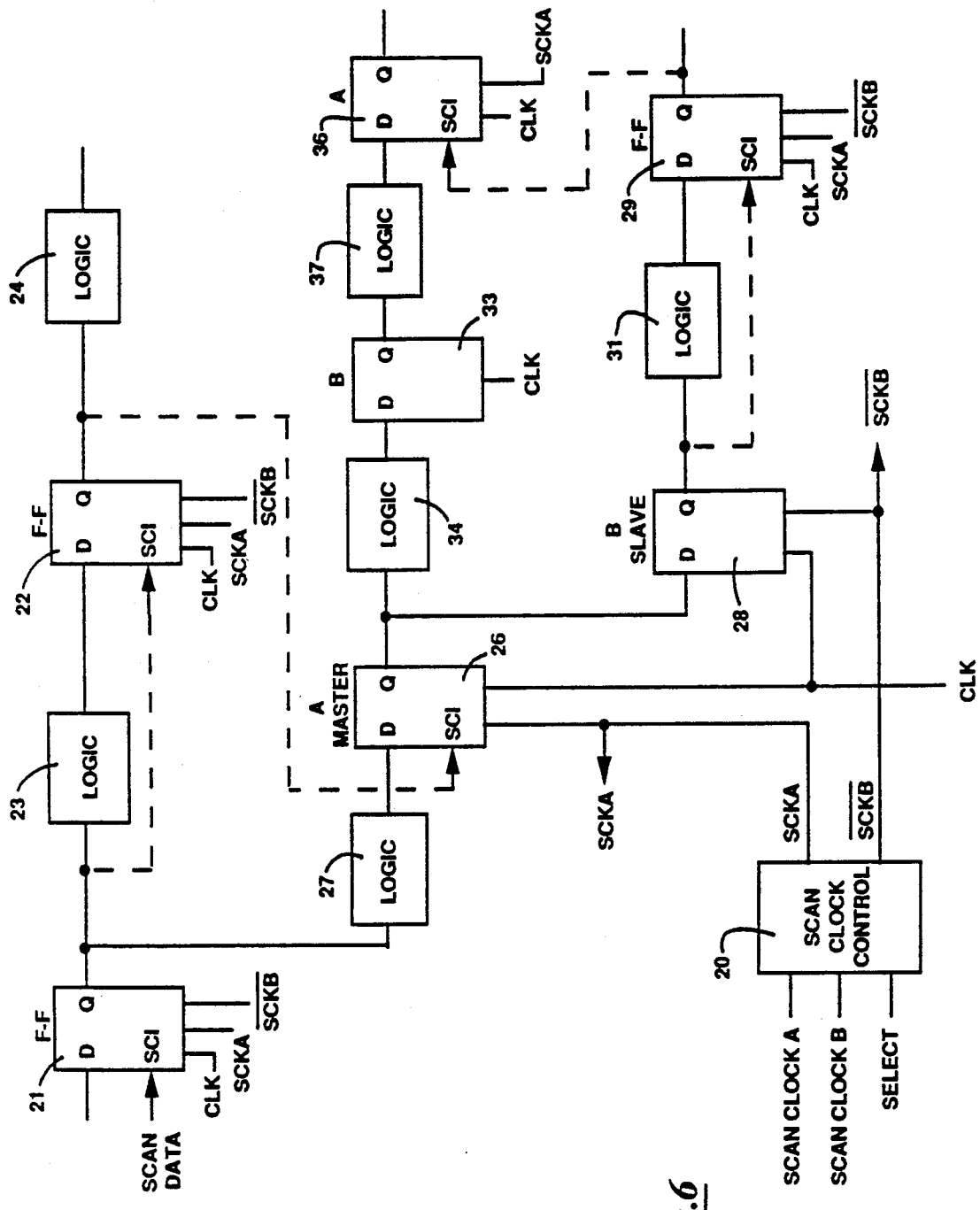
FIG. 6 is a block diagram of a logic system utilizing the latch circuits of the preceding figures.

FIG. 6 illustrates one example of a logic system utilizing the invention. Non-overlapping scan clocks SCAN CLOCK A and SCAN CLOCK B are applied to a scan clock control 20, along with the SELECT signal. The scan clock control is a logic circuit which generates SCKA and $\overline{SCKB}$ from SCAN CLOCK A and SCAN CLOCK B in accordance with the following Boolean relationships:

SCKA = SCAN CLOCK A $\overline{SCKB}$ = SELECT ∧ $\overline{SCAN\ CLOCK\ B}$

The system shown in FIG. 6 also includes a flip-flop 21 which consists of a master-slave latch pair as shown in FIG. 2 configured as a flip-flop, with edge-triggering occurring on the falling edge of the clock signal CLK. Flip-flop 21 drives a similar flip-flop 22 through a logic circuit 23. Flip-flop 22, in turn, drives another logic circuit 24.

Flip-flop 21 also drives a phase A master latch 26 through a logic circuit 27. This latch is similar to the circuit of FIG. 1, and it drives a slave latch 28 of the type shown in FIG. 2 or FIG. 5. The slave latch is directly connected to the master output, the two latches have a common clock terminal, and the slave is available for both logic and scan purposes. The slave drives a flip-flop 29 similar to flip-flop 21 through a logic circuit 31.

Phase A master latch 26 also drives a simple phase B latch 33 of the type shown in FIG. 4 through a logic circuit 34, and the B latch drives another master latch 36 through a logic circuit 37. The B latch is transparent during scanning with the system clock CLK low.

The square wave differential clock CLK is applied to all of the state elements in the system of FIG. 6. The scan clocks SCKA, $\overline{SCKB}$ are applied to the flip-flops, the scan clock phase SCKA is applied to all of the master latches, and the scan clock phase $\overline{SCKB}$ is applied to the slave latches. All of the master-slave latch pairs in the system can be serially connected together in a scan chain, with the output of any flip-flop or slave latch being connected to the scan input SCI of any other flip-flop or master latch. In the embodiment of FIG. 6, an example of a scan chain connection is shown in dashed lines. This particular connection is shown by way of example, and it is to be understood that the scan chain elements can be connected in any desired order. In the example of FIG. 6, the scan data is applied to the scan input SCI of flip-flop 21, and the serial connection goes from flip-flop 21 to flip-flop 22 to master-slave pair 26, 28 to flip-flop 29 to master latch 36.

The invention has a number of important features and advantages. It permits two-phase latches and edge-triggered flip-flops to be intermixed in a system, and the system designer is free to choose the appropriate state elements for a given application. A single square wave differential clock is used for all state elements, and it is not necessary to generate and distribute two independent non-overlapping clock phases. This allows higher clock frequency operation and save power and routing resources. Master and slave latches can be associated in the same structure with a common square wave clock, and this allows a direct master to slave connection without additional delay for skew protection. Level sensitive scan is under the control of two low frequency non-overlapping scan clock phases, making the scan mode non-critical for timing. The master latch has built-in front end logic consisting of scan data multiplexing and optional 2-level ECL functions such as a 2:1 multiplexer ahead of the D input. This saves components, eliminates the need for additional stages of circuits and avoids the propagation delays associated therewith.

It is apparent from the foregoing that a new and improved latch circuit and method have been provided. While only certain presently preferred embodiments have been described in detail, as will be apparent to those familiar with the art, certain changes and modifications can be made without departing from the scope of the invention as defined by the following claims.

We claim:

1. In a latch circuit having normal and scanning modes of operation: a master latch having a normal data input terminal and a scan data input terminal, a slave latch connected to the master latch, means for applying a differential pair of clock signals to the master latch and to the slave latch during the normal mode of operation to load data from the normal data input terminal to the master latch and to transfer the normal data from the master latch to the slave latch, and means for applying two separate non-overlapping scan clock phases separate from the differential pair of clock signals to the two latches during the scanning mode to load data from the scan data input terminal to the master latch and to transfer the scan data from the master latch to the slave latch.

2. The latch circuit of claim 1 including means for applying the differential pair of clock signals to the two latches in a complementary manner so that one of the latches holds data while the other latch is transparent.

3. In a latch circuit: a master latch having first and second data input terminals, a slave latch connected to the master latch, means for applying a differential pair of clock signals to the master latch and to the slave latch in a complementary manner to clock data from the first input terminal to the master latch while the slave latch is holding data and to clock data from the master latch to the slave latch while the master latch is holding data, means for applying a first clock signal separate from the differential pair of clock signals to the master latch to clock data from the second input terminal to the master latch, and means for applying a second clock signal separate from the differential pair of clock signals to the slave latch to clock data from the master latch to the slave latch.

4. In a latch circuit: a master latch and a slave latch each having an input pair and a latch pair, means for applying a differential pair of clock signals to the latches with one of the clock signals being applied to the input pair in the master latch and to the latch pair in the slave latch and the other clock signal being applied to the latch pair in the master latch and to the input pair in the slave latch, a second input pair connected to the latch pair in the master latch, means for applying a first clock phase separate from the clock signals to the second input pair and to the latch pair in the master latch to load data into the master latch through the second input pair, and means for applying a second clock phase separate from the clock signals to the input pair and to the latch pair in the slave latch to transfer the data from the master latch to the slave latch.

5. The latch circuit of claim 4 wherein the means for applying the differential pair of clock signals includes a first pair of transistors for applying the respective clock signals to the input pair and the latch pair in the slave latch, and the means for applying the second clock phase includes a second pair of transistors connected between one of the transistors in the first pair and the input and latch pairs in the slave latch.

6. In a method of clocking data in a latch circuit having master and slave latches with normal and scanning modes of operation, the steps of: presenting data to normal and scan data input terminals of the master latch, applying a differential pair of clock signals to the master latch and to the slave latch during the normal mode of operation to load data from the normal data input terminal to the master latch and to transfer the normal data from the master latch to the slave latch, and applying two separate non-overlapping scan clock phases to the two latches during the scanning mode to load data from the scan data input terminal to the master latch and to transfer the scan data from the master latch to the slave latch.

7. The method of claim 6 wherein the differential pair of clock signals is applied to the two latches in a complementary manner so that one of the latches holds data while the other latch is transparent.

8. In a method of clocking data in a latch circuit having a master latch with first and second data input terminals, and a slave latch connected to the master latch, the steps of: applying a differential pair of clock signals to the master latch and to the slave latch in a complementary manner to clock data from the first input terminal to the master latch while the slave latch is holding data and to clock data from the master latch to the slave latch while the master latch is holding data, applying a first clock phase to the master latch to clock data from the second input terminal to the master latch, and applying a second clock phase to the slave latch to clock the second input data from the master latch to the slave latch.

9. In a method of clocking data in a latch circuit having a master latch with first and second input pairs and a latch pair, and a slave latch with an input pair and a latch pair, the steps of applying a differential pair of clock signals to the latches in such manner that one of the clock signals is applied to the first input pair in the master latch and to the latch pair in the slave latch and the other clock signal is applied to the latch pair in the master latch and to the input pair in the slave latch, applying a first clock signal to the second input pair and to the latch pair in the master latch to load data into the master latch through the second input pair, and applying a second clock signal to the input pair and to the latch pair in the slave latch to transfer the data from the master latch to the slave latch.

10. The method of claim 9 wherein the respective ones of the differential pair of clock signals are applied to the input pair and the latch pair in the slave latch by a first pair of transistors, the second clock signal is applied to the input and latch pairs in the slave latch by a second pair of transistors connected between one of the transistors in the first pair and the input and latch pairs in the slave latch.

11. In a latch circuit: first and second ECL input pairs, an ECL latch pair, sources of first and second clock signals, a first switching pair responsive to one of the clock signals for selectively steering current toward either the second input pair or the latch pair, and a second switching pair responsive to the other clock signal for selectively steering current toward either the first input pair or the first switching pair.

12. The latch circuit of claim 11 including an additional input pair and an additional switching pair connected between the second swithing pair and the first and additional input pairs for selectively steering current toward either the first input pair or the additional input pair.

13. In a method of operating an ECL latch circuit having first and second input pairs, first and second clock inputs, and a latch pair, the steps of: selectively steering current toward either the second input pair or the latch pair under control of a signal applied to the first clock input, and selectively steering current toward either the first input pair or the second input pair and the latch pair under control of a signal applied to the second clock input.

14. The method of claim 13 including the steps of applying data to an additional input pair, and steering current toward either the first input pair or the additional input pair to select data for loading into the latch.

15. In a latch circuit: a master latch having a first data input terminal and a second data input terminal, a slave latch connected to the master latch, means for applying a differential clock pair to both the master latch and the slave latch to load data from the first data input terminal to the master latch and to transfer data from the master latch to the slave latch, and means for applying a second set of clock signals to the master latch and to the slave latch to load data from the second data input terminal to the master latch and to transfer data from the master latch to the slave latch, said second set of clock signals being separate and distinct from the differential clock pair.

16. In a latch circuit: a master latch having a first data input terminal and a second data input terminal, a slave latch connected to the master latch, means for applying a first set of clock signals to the master latch and to the slave latch to load data from the first data input terminal to the master latch and to transfer data from the master latch to the slave latch, and means for applying a separate non-overlapping clock signals to respective ones of the latches to load data from the second data input terminal to the master latch and to transfer data from the master latch to the slave latch, said non-overlapping clock signals being separate and distinct from the first set of clock signals.

17. In a latch circuit: a master latch having a first data input terminal and a second data input terminal, a slave latch connected to the master latch, means for applying a first set of clock signals to the master latch and to the slave latch to load data from the first data input terminal to the master latch and to transfer data from the master latch to the slave latch, said clock signals being applied to the two latches in a complementary manner so that one of the latches holds data while the other latch is transparent, and means for applying a second set of clock signals to the master latch and to the slave latch to load data from the second data input terminal to the master latch and to transfer data from the master latch to the slave latch, said first and second sets of clock signals being separate and distinct from each other.

18. In a method of clocking data into master and slave latches, the steps of presenting data to first and second data input terminals in the master latch, applying a differential pair of clock signals to both the master latch and the slave latch to load data from the first data input terminal to the master latch and to transfer data from the master latch to the slave latch, and applying a second set of clock signals to the master latch and to the slave latch to load data from the second data input terminal to the master latch and to transfer the second input data from the master latch to the slave latch.

19. In a method of clocking data into master and slave latches, the steps of presenting data to first and second data input terminals in the master latch, applying a first set of clock signals to the master latch and to the slave latch to load data from the first data input terminal to the master latch and to transfer data from the master latch to the slave latch, and applying a set of separate non-overlapping clock signals to respective ones of the master and slave latches to load data from the second data input terminal to the master latch and to transfer the second input data from the master latch to the slave latch.

20. In a method of clocking data into master and slave latches, the steps of presenting data to first and second data input terminals in the master latch, applying a first set of clock signals to the master latch and to the slave latch to load data from the first data input terminal to the master latch and to transfer data from the master latch to the slave latch, said signals being applied in a complementary manner so that one of the latches holds data while the other latch is transparent and applying a second set of clock signals to the master latch and to the slave latch to load data from the second data input terminal to the master latch and to transfer the second input data from the master latch to the slave latch.

* * * * *